US005841377A

United States Patent [19]

Takamizawa et al.

[11] Patent Number: 5,841,377

[45] Date of Patent: Nov. 24, 1998

[54] ADAPTIVE TRANSFORM CODING SYSTEM, ADAPTIVE TRANSFORM DECODING SYSTEM AND ADAPTIVE TRANSFORM CODING/DECODING SYSTEM

[75] Inventors: Yuichiro Takamizawa; Masahiro Iwadare, both of Tokyo, Japan

[73] Assignee: NEC Corporation, Tokyo, Japan

[21] Appl. No.: 886,470

[22] Filed: Jul. 1, 1997

[30] Foreign Application Priority Data

Jul. 1, 1996 [JP] Japan .................................... 8-171423

[51] Int. Cl.$^{6}$ ...................................................... H03M 7/00

[52] U.S. Cl. ............................................. 341/51; 382/248

[58] Field of Search ............................. 341/51, 106, 107, 341/200, 141; 348/395, 403; 382/248

[56] References Cited

U.S. PATENT DOCUMENTS

| | | | |
|---|---|---|---|
| 4,982,282 | 1/1991 | Saito et al. | 358/133 |
| 5,045,938 | 9/1991 | Sugiyama | 358/133 |
| 5,047,852 | 9/1991 | Hanyu et al. | 341/60 |
| 5,396,237 | 3/1995 | Ohta | 341/50 |

FOREIGN PATENT DOCUMENTS

| | | | |
|---|---|---|---|
| 0 682 337 | 11/1995 | European Pat. Off. | G10L 7/04 |

OTHER PUBLICATIONS

"Coding of Moving Pictures and Associated Audo for Digital Storage Media at up to about 1.5 Mbit/s", ISO/IEC 11172-3, 1993, pp. 1–50.

*Primary Examiner*—Brian K. Young
*Attorney, Agent, or Firm*—Foley & Lardner

[57] ABSTRACT

In an adaptive transform coding system and/or and adaptive transform decoding system, coding efficiency in the case where a small number of quantized values having large absolute value are present, is improved. The adaptive transform coding system codes the small number of quantized values having large absolute values and other quantized values are coded separately. More particularly, the adaptive transform coding system includes a selector (6) discriminating the small number of quantized value having large absolute value from other quantized value, a pulse coding means for coding the small number of quantized values having large absolute values (8) and the pulse decoding means (16) for decoding the same, a coding means (7) for coding the quantized value other than those having large absolute values and a decoding means (15) decoding the same, and a synthesis means (18) for synthesizing the small number of quantized values having large absolute value and other quantized values.

18 Claims, 9 Drawing Sheets

ADAPTIVE TRANSFORM CODING SYSTEM, ADAPTIVE TRANSFORM DECODING SYSTEM AND ADAPTIVE TRANSFORM CODING/DECODING SYSTEM

BACKGROUND OF THE INVENTION

1. Field of the Invention

The present invention relates generally to an adaptive transform coding and/or decoding system. More specifically, the invention relates to a system for efficiently coding and decoding speech and audio signals with maintaining high quality.

2. Description of the Related Art

Conventionally, as an adaptive transform coding system and an adaptive transform decoding system for efficiently coding and decoding a speech signal and an audio signal with maintaining high quality, there are MPEG (Moving Pictures Expert Group)/Audio Layers 3 or so forth. The technology of MPEG/Audio Layer 3 has been discussed in 1993 ISO/IEC 11172-3, "Coding of Moving Pictures and Associated Audio for Digital Storage Media at up to about 1.5 Mb/s" (hereinafter simply referred to as reference No. 1).

FIG. 3 is a block diagram showing one example of the conventional adaptive transform coding system. The conventional adaptive transform coding system is constructed with an input terminal 1, a transform means 2, an analysis means 3, a quantizing parameter determining means 4, a quantizing means 5, a coding means 7, a parameter coding means 9, an adder 22, a multiplexer 23 and an output terminal 12.

In the input terminal 1, digitized audio signal samples are inputted. The input audio samples are outputted to the transform means 2 and an analysis means 3.

In the transform means 2, at every input of N time-domain audio samples, N frequency-domain-samples are generated from the input audio samples by a hybrid analysis filter bank. N frequency-domain-samples grouped in ascending order are referred to as "frame". The derived frequency-domain-samples are outputted to the quantizing means 5 and the analysis means 3. N is a positive integer, and in case of MPEG/Audio Layer 3, N is 576. The hybrid analysis filter bank has been discussed in detail in the foregoing reference 1.

In the analysis means 3, an allowable quantization error for each frequency-domain-sample in the frame is derived and outputted to the quantization parameter determining means 4. In coding of the audio signal, a subjective quality is important. Therefore, allowable quantization error is determined so that the degradation of the frequency domain signals is not easily perceptible by human acoustic sense. The manner of determining the allowable quantization error has also been discussed in detail in the reference 1. For example, there is a method to analyze a frequency spectrum obtained through Fourier transform of the input audio samples.

In the quantizing means 5, the frequency domain signal X is quantized on the basis of a quantization step size QS derived from the quantization parameter determining means 4, Then, the quantized value Y is derived from rounding the (¾)th power of quantized frequency domain signal. Namely, the quantized value Y is expressed by:

$$Y=nint(pow(X/S,\ 3/4))$$

Wherein nint ( ) represents rounding process for rounding the fraction off after the decimal point, and pow (a, b) represents a to the (b)th power. The quantized values in each frame are grouped in ascending order in the frequency to be fed to the coding means 7. On the order hand, the quantizing means 5 calculates a quantization error YZ to output to the quantization parameter determining means 4. An inverse-quantized value YY of the quantized value Y is expressed by:

$$YY=pow(Y,\ 4/3)$$

Therefore, the quantization error YZ is expressed as:

$$YZ=X-pow(Y,\ 4/3)$$

In the coding means 7, as set out in detail later, each quantized value in the frame is encoded. Then, a code C1 and a code amount L1 of the code C1 are derived. The code C1 is outputted to the multiplexer 23, and the code amount L1 is outputted to the adder 22.

In the parameter coding means 9, the quantization step size QS inputted from the quantization parameter determining means 4 is encoded. Then, a code C2 and a code amount L2 of the code C2 are derived. The code C2 is inputted to the multiplexer 23 and the code amount L2 is inputted to the adder 22.

In the adder 22, the total code amount outputted from the coding means 7 and the parameter coding means 9, namely the sum of L1 and L2, is derived, and outputted to the quantization parameter determining means 4 as a total code amount.

The total code amount outputted from the adder 22 is variable depending upon the size of the quantization step size QS. Generally, when the quantization step size QS becomes smaller, the total code amount becomes larger and when the quantization step size QS becomes larger, the total code amount becomes smaller. In the quantization parameter determining means 4, the quantization step size Q is controlled so that the total code amount can be maintained to be less than or equal to the allowable code amount which is determined on the basis of the coding bit rate, and that the quantization error is proportional to the allowable quantization error. For an example of this control, at first, the quantization step size QS is set at sufficiently small value, and the coding means 7 and the parameter coding means 9 are operated to derive the total code amount. Then, the following two operations are repeated until the total code amount becomes equal or less than the allowable code amount. As the first operation, the quantization step size QS is set at a greater value in proportion to the allowable quantization error. Then, the coding means 7 and the parameter coding means 9 are operated to derive the total code amount.

In the multiplexer 23, the codes C1 and C2 are multiplexed to generate a bit stream.

The bit stream is outputted from the output terminal 12.

In the coding means 7, the quantized values of the frame are divided into three regions on the frequency axis, i.e. a type 1 region, a type 2 region, and a type 3 region. Each quantized values in the type 1 region and the type 2 region are Huffman-encoded.

At first, a method for dividing the quantized values in the frame into three regions will be discussed. The N quantized-values are grouped in ascending order of the frequency and compose the vector X as follows:

Vector X=[x(1), x(2), . . . , x(N)]

Each element x(1), x(2), . . . , x(N) of the vector X represents respective quantized value. The type 1 region includes the quantized values of the low frequency signal, and includes x(1), x(2), . . . , X(2×bigvalues) of (2×bigvalues) elements. The type 2 region includes the quantized values whose absolute values are 0 or 1 and includes x(2×bigvalues+1), x(2×bigvalues+2), . . . , x(2×bitvalues+4×count 1) of (4×count1) elements. The type 3 region includes elements whose values are zero, and includes x(2×big values+4×count1+1), x(2×bigvalues+4×count1+2), . . . , x(N) of (2×rzero) elements. Here, $$2\times big\_values+4\times count1\times2\times rzero=N.$$

The value rzero is calculated by $$rzero=(N-t(t\ mod\ 2))/2$$

where t is the maximum value satisfying $$x(t)\neq0,\ (t=1,\ 2,\ .\ .\ .\ ,\ N)$$

(x1 mod x2) represents the remainder in division of x1 by x2.

The value count1 is calculated by $$count1=(N-rzero\times2-t2\ -((N-rzero\times2-t2)\ mod\ 4/4$$

where t2 is the maximum value satisfying |x(t2)|>1.

The value bigvalues is derived from $$big\_values=(N-rzero\times2-count1\times4)/2$$

Each element included in the type 1 and type 2 regions is Huffman-coded employing a table selected among prepared Huffman tables for respective regions. An appropriate Huffman table is selected so that the total amount of the Huffman code becomes minimum.

Huffman tables prepared for coding respective elements in the type 1 region are different in terms of the assumed appearance frequency of respective element-values and the region of the quantized values to be coded. The region of the quantized values to be coded by the Huffman table selected upon coding of each element in the type 1 region becomes larger depending upon the maximum absolute value of respective elements included in the type 1 region. At the same time, each code in the Huffman table generally becomes longer. On the other hand, since the type 2 region includes only elements having absolute values 0 or 1, the average code amount per one element upon coding in the type 2 region becomes smaller than that of the type 1 region.

The bigvalues, rzero and information relating to the Huffman tables to be used in the type 1 region and the type 2 region are coded as side information. The Huffman code and the side information are multiplexed and outputted as the code C1.

FIG. 4 is a block diagram showing one example of the adaptive transform decoding system. The conventional adaptive transform decoding system includes an input terminal 13, a demultiplexer 24, a decoding means 15, a parameter decoding means, an inverse quantizing means 19, an inverse transform means 20 and the output terminal 21.

To the input terminal 13, the bit stream is inputted. The bit stream is then outputted to the demultiplexer 24.

In the demultiplexer 24, the bit stream is separated into the code C1 and the code C2. The code C1 is outputted to the decoding means 15 and the code C2 is outputted to the parameter decoding means 17. In the parameter decoding means 17, the quantization step size is derived by decoding the code C2. The derived quantization step size is outputted to the inverse quantizing means 19.

In the decoding means 15, at first, the code C1 is separated into the Huffman codes and the side information. Next, the quantized values of the type 1 region and the type 2 region are derived by decoding the Huffman codes using the Huffman table indicated by the side information. The quantized values thus obtained are fed to the inverse quantizing means 19.

In the inverse quantizing means 19, an inverse quantized value is derived by the inverse quantization of the quantized value. The inverse quantized value YY is derived from the quantized value Y through the following equation:

$$YY=pow(Y,\ 4/3)$$

The inverse quantized values thus derived are outputted to the inverse transform means 20.

The inverse transform means 20 derives a time domain signal from the inverse quantized values through a hybrid synthesis filter bank. The hybrid synthesis filter bank has been discussed in detail in the foregoing reference 1.

Then, the time domain signal is outputted from the output terminal 21.

A first problem encountered in the foregoing adaptive transform coding and decoding systems is low coding efficiency upon coding the element in the vicinity of the boundary to the type 2 region in the type 1 region.

Most elements of the type 1 region in the vicinity of the boundary to the type 2 region have absolute value of 0 or 1 similar to the elements in the type 2 region. These elements may be encoded by using the Huffman code table for the type 2 region. However, because of the presence of a small number of elements having absolute value of 2 or more, in the vicinity of the boundary to the type 2 region, the elements having absolute value 0 or 1 in the vicinity of the boundary to the type 2 region of the type 1 region should be coded as elements in the type 1 region. Since the average code amount for one element in the type 1 region is larger than that in the type 2 region, when a small number of elements having absolute value of 2 or more are included in the type 1 region in the vicinity of the boundary to the type 2 region, the coding efficiency is degraded.

The second problem to be encountered is that when the type 1 region includes a small number of elements having a large absolute value, the coding efficiency is degraded.

The size of the Huffman table to be selected upon coding the elements in the type 1 region becomes larger depending upon the maximum absolute value of the element included in the type 1 region. At the same time, each code length in the Huffman table becomes longer. When the type 1 region includes a small number of elements having large absolute value, the average code amount for one element becomes large and the coding efficiency is degraded.

SUMMARY OF THE INVENTION

It is therefore an object of the present invention to provide an adaptive transform coding system, an adaptive transform decoding system and an adaptive transform coding and decoding system, which can improve the coding efficiency by performing a special process for the elements having a large absolute value.

According to the first aspect of the invention, an adaptive transform coding system comprises:

a transform means for transforming a set of input signal samples into a frequency domain;

an analysis means for analyzing the input signal and the frequency domain signal to derive an allowable quantization error;

a quantizing means for quantizing the amplitude value of the frequency domain signal on the basis of a quantization step size to derive a quantized value and a quantization error, a quantization parameter determining means for determining the quantization step size with reference to the allowable quantization error and the quantization error and a total code amount;

a selector for analyzing the quantized value of the frequency domain signal to derive a first signal and a second signal;

a first coding means for coding the quantized value of the first signal with reference to the second signal to derive a first code and a first code amount;

a second coding means for coding the quantized value of the second signal to derive a second code and a second code amount;

a parameter coding means for coding the quantization step size to derive a third code and a third code amount;

an adder for deriving the total code amount of the first code amount, the second code amount and the third code amount; and a multiplexer for multiplexing the first code, the second code and the third code to generate a bit stream.

In the construction set forth above, the small number of quantized values having large absolute value and the other quantized values are coded by different means. Therefore, in the coding means for coding the quantized values other than those having the large absolute values, a Huffman code table can be smaller than that in the prior art to reduce the average code amount for one quantized value and thus the improvement of the coding efficiency can be achieved.

The second coding means may divide the quantized values of the frequency domain signal into a first signal and a third signal to generate a fourth signal, in which the absolute value of the quantized value of the first signal is replaced with smaller quantized value, and the second signal may be generated by combining the third signal and the fourth signal. Also, the selector may derive the first signal and the second signal so that the total code amount becomes minimum. The first coding means may generate the first code by coding the absolute value of the quantized value of the first signal, the polarity of the quantized value of the first signal and the frequency of the first signal. In this case, the first coding means may derive a threshold for the quantized value of the first signal to code a value derived by subtracting the threshold from the quantized value of the first signal in place of the absolute value of the quantized value of the first signal. In each sample of the first signal, the threshold value may be a value derived by adding one for the absolute value of the quantized value of a sample of the second signal at the same frequency to the sample of the first signal. Also, a region of quantized values to be coded in the second coding means may be limited, and for each sample of the first signal, the threshold may be a value derived by adding one to a maximum absolute value of an input region of the second coding means upon coding the signal having the same frequency as that of the sample by the second coding means.

In the alternative, the first coding means may code the frequency of each sample of the first signal in the ascending order of the frequency, and for the sample other than the sample having the lowest frequency, the difference of the frequency between a sample and its adjacent predecessor is coded. The frequency signal may be divided into a plurality of regions, and in the first coding means, in place of the frequency of the sample having the lowest frequency, the number of boundaries lower than the frequency of the sample having the lowest frequency, and the difference between the maximum region boundary frequency lower than the frequency of the sample having the lowest frequency and the said lowest frequency, are coded.

According to the second aspect of the invention, an adaptive transform decoding system comprising:

a demultiplexer for separating an input signal into a first code, a second code and a third code;

a first decoding means for decoding the first code with reference to the second code to derive a first signal;

a second decoding means for decoding the second code to derive a second signal;

a parameter decoding means for decoding the third signal to derive a quantization step size;

a synthesis means for synthesizing the first signal and the second signal for deriving a synthesized signal;

an inverse quantizing means for inverse quantizing the quantized value of the synthesized signal to derive an inverse quantized signal; and an inverse transform means for transforming the inverse quantized signal into a time domain signal.

The first decoding means may derive a frequency of the quantized value, an absolute value of the quantized value and the polarity of the quantized value by decoding the first code to set a frequency of the quantized value, an absolute value of the quantized value and the polarity of the quantized value of the first signal, respectively. The first decoding means may derive a threshold and take a value derived by adding the threshold to the absolute value of the quantized value derived by decoding the first code as an absolute value of the quantized value of the first signal, in place of the absolute value of the quantized value derived by decoding the first code. In each sample of the first signal, the threshold may be obtained by quantizing the second signal at the same frequency and taking its absolute value. The second decoding means may have a restriction in an inverse quantized value, and in each sample of the first signal, the threshold may be a value derived by adding one to the maximum absolute value of the restriction when the second decoding means decodes the signal having the same frequency as the sample.

The first decoding means may derive a difference of the frequency and the frequency of the sample of the lowest frequency, and derives the frequency of the sample other than the sample having the lowest frequency by adding the difference of the frequency to the frequency of its adjacent predecessor. In this case, the frequency domain signal is divided into a plurality of region. In the first decoding means, the number of region boundaries and the difference of the frequencies may be derived by decoding, and a value derived by adding a difference of the frequencies to a frequency of the region boundary indicated by the number of the region boundary is taken as the frequency of the sample having the lowest frequency.

The synthesis means may generate a signal replacing the quantized value of the sample having the same frequency as the frequency of each sample of the first signal with the quantized value of the first signal to take the replaced signal as the synthesized signal.

According to the third aspect of the invention, an adaptive transform coding and decoding system comprises:

- a transform means for transforming an input signal into a frequency domain signal;
- an analysis means for analyzing the input signal and the frequency domain signal to derive an allowable quantization error;
- a quantizing means for quantizing the amplitude value of the frequency domain signal on the basis of a quantization step size to derive a quantized value and a quantization error,
- a quantization parameter determining means for determining the quantization step size with reference to the allowable quantization error and the quantization error and a total code amount;
- a selector for analyzing the quantized value of the frequency domain signal to derive a first signal and a second signal;
- a first coding means for coding the quantized value of the first signal with reference to the second signal to derive a first code and a first code amount;
- a second coding means for coding the quantized value of the second signal to derive a second code and a second code amount;
- a parameter coding means for coding the quantization step size to derive a third code and a third code amount;
- an adder portion for deriving the total code amount of the first code amount, the second code amount and the third code amount;
- a multiplexer for multiplexing the first code, the second code and the third code to generate a bit stream
- a demultiplexer for separating an input signal into a first code, a second code and a third code;
- a first decoding means for decoding the first code with reference to the second code to derive a first signal;
- a second decoding means for decoding the second code to derive a second signal;
- a parameter decoding means for decoding the third signal to derive a quantization step size;
- a synthesis means for synthesizing the first signal and the second signal for deriving a synthesized signal;
- an inverse quantizing means for inverse quantizing the quantized value of the synthesized signal to derive an inverse quantized signal; and
- an inverse transform means for transforming the inverse quantized signal into a time domain signal.

BRIEF DESCRIPTION OF THE DRAWINGS

The present invention will be understood more fully from the detailed description given hereinafter and from the accompanying drawings of the preferred embodiments of the present invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscure of the present invention.

Figure 1:
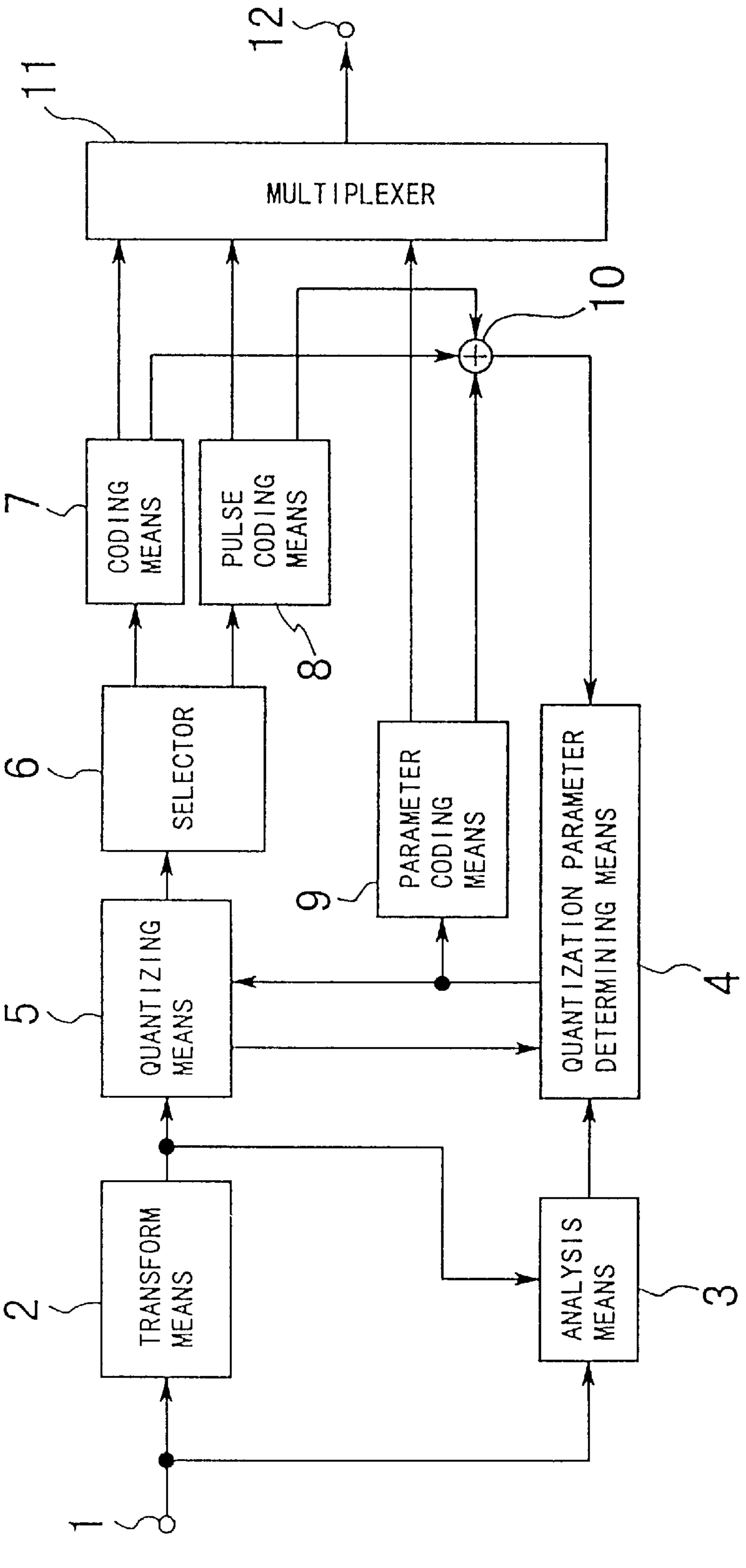
FIG. 1 is a block diagram showing the preferred embodiment of a coding system according to the present invention.

FIG. 1 is a block diagram showing one embodiment of an adaptive transform coding system according to the present invention. The adaptive transform coding system according to the invention is constructed with an input terminal 1, a transform means 2, an analysis means 3, a quantization parameter determining means 4, a quantizing means 5, a selector 6, a coding means 7, a pulse coding means 8, a parameter coding means 9, an adder 10, a multiplexer 11 and an output terminal 12.

Figure 3:
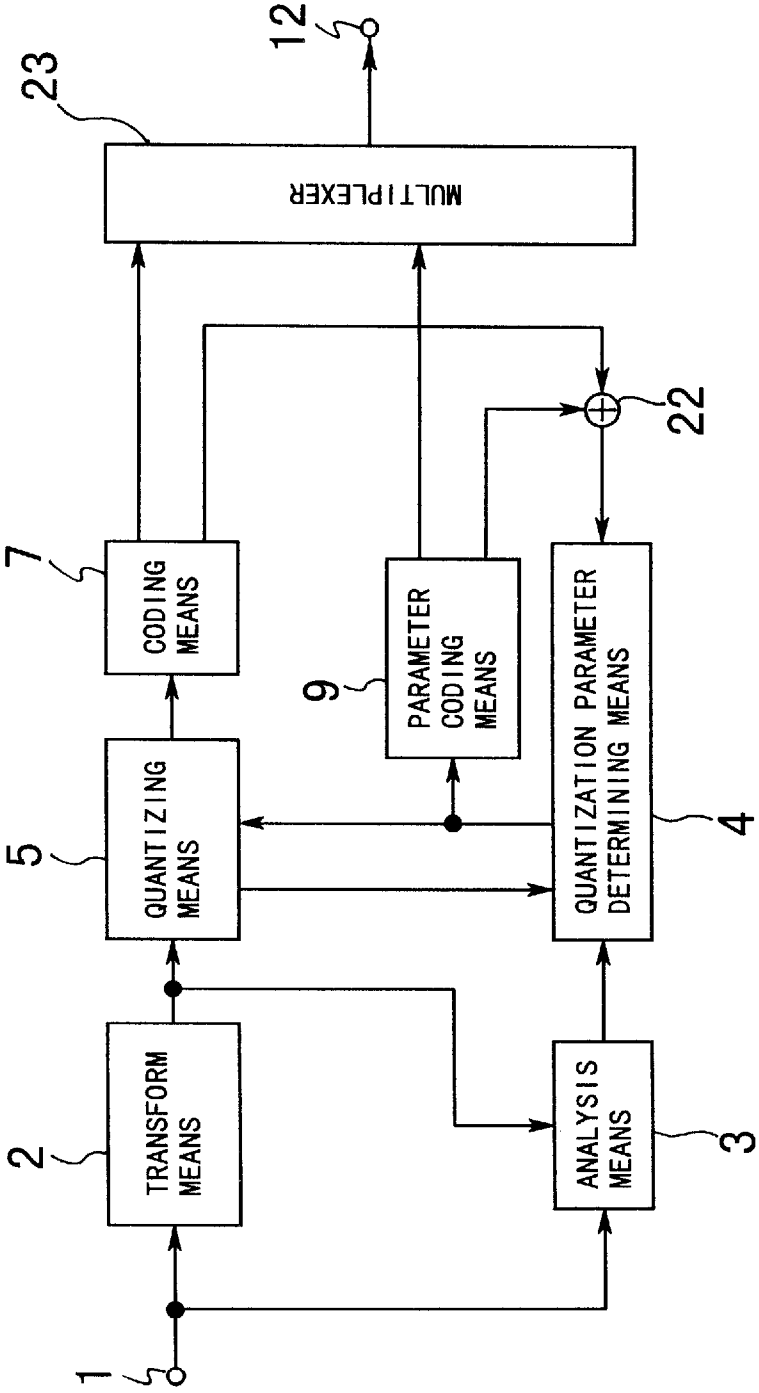
FIG. 3 PRIOR ART
FIG. 3 is a block diagram showing the conventional coding system.

In comparison with the prior art, the shown embodiment of the adaptive transform coding system includes the selector 6 and the pulse coding means 8 as additional elements. Also, the shown embodiment of the adaptive transform coding system employs the multiplexer 11 in place of the multiplexer 23 in FIG. 3, and the adder 10 in place of the adder 22 in FIG. 3. Other elements are the same or substantially the same as those in the prior art discussed with respect to FIG. 3. Therefore, the following discussion will be concentrated on operations of the selector 6, the pulse coding means 8, the adder 10 and the multiplexer 11 which are different points relative to the prior art.

In the selector 6, three steps of process are performed.

At the first step, similarly to the coding means 7 in the prior art, the quantized values are grouped in ascending order to form:

$$\text{Vector } X=[x(1), x(2), \ldots, x(N)]$$

Then, in the similar manner to that in the coding means 7 in the prior art, respective elements $x(1), x(2), \ldots, x(N)$ in the vector X are divided into the type 1 region, the type 2 region and the type 3 region.

Next, as the second step, a that represents the number of elements of the vector X which are located in the type 1 region in the vicinity of the boundary to the type 2 region and have absolute values greater than or equal to two and, in the shown embodiment, are replaced the absolute values with zero is derived. Here, it is assumed that M is a constant value of an upper limit of the number of elements, for which the absolute values are replaced with zero. When coding is performing by replacing m elements which have the absolute value greater than or equal to two with zero, the total code amount L(m) is derived from the outputs of the coding means 7 and the pulse coding means 8 for $m=0, 1, \ldots, M$.

Then, m at which minimizes the total code amount L(m) is set as the number a of elements whose values are replaced with zero.

Figure 5:
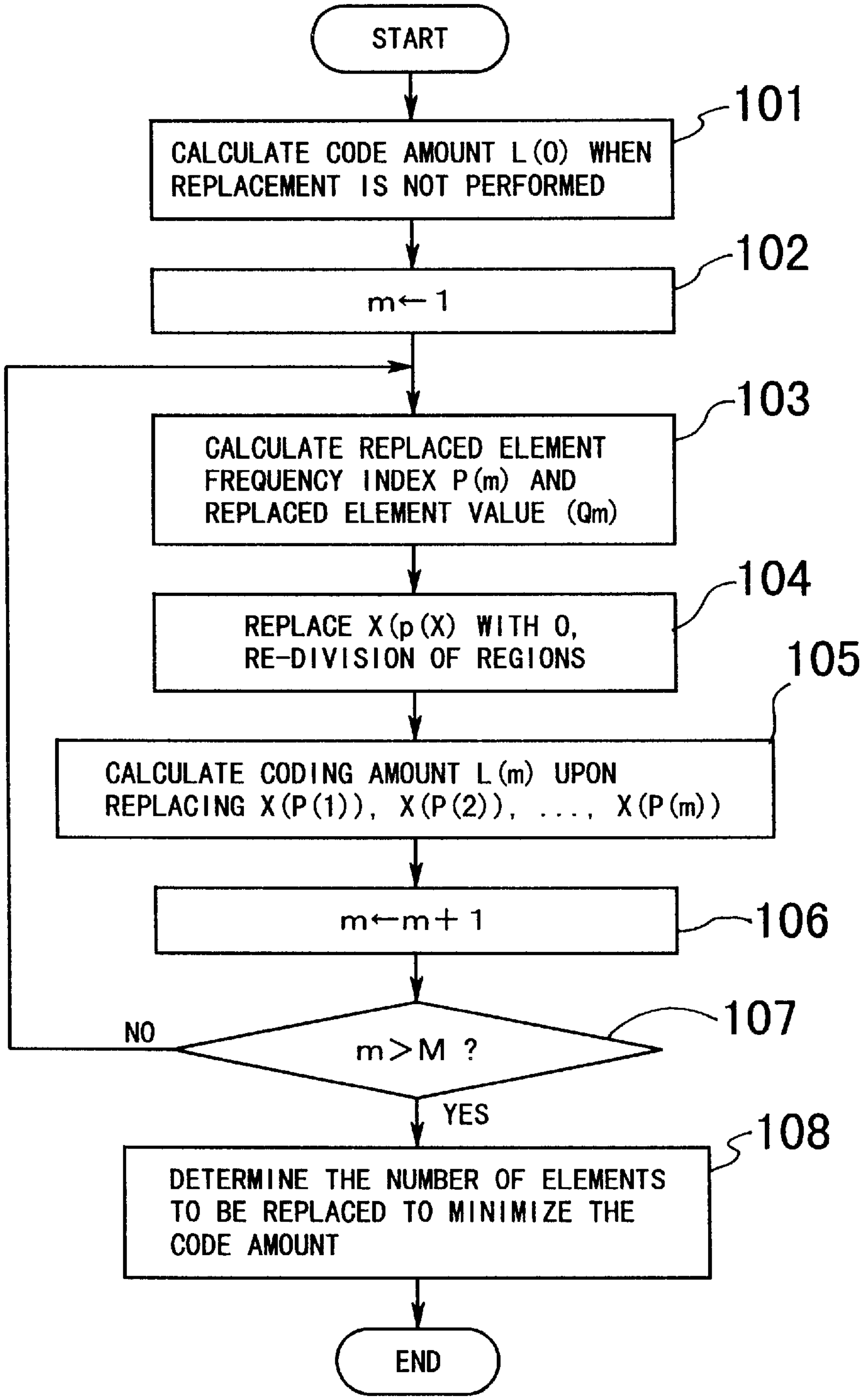
FIG. 5 is a flowchart for deriving the number of elements to be replaced with zero in the present invention.

FIG. 5 is a flowchart showing a process for deriving the number a of the elements. Each step in the process will be discussed hereinafter.

At step 101, a code amount L(0) of the code output by the coding means 7 when each element of the type 1 and the type 2 regions is coded by Huffman coding is derived. The value of the vector X is stored in the vector V.

At step 102, m is set at one.

At step 103, a frequency index P(m) of replaced elements and a value Q(m) of replaced elements are expressed by:

$$P(m)=max\ \{i \mid 0<i<big\_values★2+1, \mid x(i) \mid >1\}$$

$$(m)=x(P(m))$$

At step 104, the elements of the vector X are divided into the regions with taking x(P(m))=0 to re-calculate big values and count1.

At step 105, a total code amount L(m)=B1+B2 of a code amount B1 of the code outputted by the coding means upon Huffman coding of each element in the type 1 and the type 2 regions and a code amount B2 necessary for coding the number m of replaced elements, the frequency indexes P(1), P(2), . . . , P(m) of replaced elements and the values Q(1), Q(2), . . . , Q(m) of replaced elements is derived. The code amount B1 is derived by simulating the operation of the coding means 7. The code amount B2 is derived by simulating the operation of the later discussed pulse coding means 8.

At step 106, m is incremented by one.

At step 107, if m is less than or equal to the upper limit M of the replaced element number, the process returns to step 103.

At the step 108, a which minimizes {L(a)|a=0, 1, . . . , M) is established as the number of elements, whose absolute values are to be replaced. Then, the vector X is redefined as the vector V stored at step 101.

Finally, at the third step, the value of the elements in the vector X are replaced with zero to generate:

$$\text{Vector } Y=[y(1), y(2), \ldots, y(N)]$$

By subtracting the vector Y from the vector X, $$\text{Vector } Z=[z(1), z(2), \ldots, y(N)]$$

is generated. The vector Y is outputted to the coding means 7 and the information relating to non-zero elements of the vector Z is fed to the pulse coding means 8. The type 2 region cannot contain elements having absolute value greater than or equal to 2. Therefore, in the prior art, if an element having absolute value greater than or equal to two is present, all elements having frequency lower than that element having absolute value greater than or equal to two are grouped in the type 1 region for coding. By replacing the absolute value with zero for the elements having the absolute value greater than or equal to two, the type 1 region of the vector Y becomes smaller than that of the vector X, and the type 2 region is expanded. As set forth above, since the code amount for one element in the type 2 region is smaller than the code amount for one element in the type 1 region, this expansion of the type 2 region and this contraction of the type 1 region should reduce the code amount. Here, the elements of the vector X having the absolute value greater than or equal to two, which are replaced with zero, are coded by the pulse coding means 8 as the vector Z.

The vector Y is initially set as $$\text{Vector } Y=\text{Vector } X$$

Then, if the number of the replaced element a is greater than or equal to one, the vector Y is derived by establishing $$y(P(m))=0$$

with respect to m=1, 2, . . . , a using the frequency index P(m) of replaced elements and the value Q(m) of replaced elements obtained in the foregoing second step.

The vector Z is obtained as (Vector X−Vector Y). As information relating to non-zero elements of the vector Z, the number of the replaced element a, the frequency indexes P(1), P(2), . . . , P(a) of replaced elements and the values Q(1), Q(2), . . . , Q(a) of replaced elements are outputted to the pulse coding means 8.

Here, discussion has been given for the method that x(P(m)) is replaced with zero in the third step. However, it is also possible to replace the absolute value with 1 or −1 instead of 0. In this case, replacement may be performed with any one of 0, 1 and −1 at which the code amount of the code outputted by the coding means 7 becomes minimum for achieving improved efficiency of coding.

The pulse coding means 8 derives a pulse code by coding the information relating to the non-zero elements of the vector Z is outputted from the selector 6. The pulse code thus obtained to the multiplexer 11. In coding of the vector Z, at first $$PP(0)=big\_values★2+1$$

is established. Then, using the number of replaced elements a and the frequency index P(m) of replaced elements, if a is greater than or equal to one, for m=1, 2, . . . a, a frequency index offset PP(m) of replaced elements:

$$PP(m)=(P(a-m+1)-PP(m-1))$$

and, the polarity of QQ(m):

$$Q(m)=Q(a-m+1)$$

and the amplitude QQQ(m) of replaced elements:

$$QQQ(m)=(|QQ(m)|-2)$$

are encoded as the pulse code. It should be noted that it is possible to encode |QQ(m)| for the amplitude QQQ(m) of the replaced element. However, since |QQ(m)| is greater than or equal to two, it may be more efficient to encode (|QQ(m)|−2). Also, as the frequency index offset of replaced elements, P(m) can be coded. However, in general, higher coding efficiency can be achieved by PP(m). The pulse code and the number a of replaced elements are multiplexed to be outputted to the multiplexer 11 as a code C3. The code amount L3 of the code C3 is outputted to the adder 10.

The adder 10 derives a total code amount by summing the code amounts C1, C2 and C3. The derived total code amount is outputted to the quantization parameter determining means 4.

The multiplexer 11 multiplexes the codes C1, C2 and C3 to generate a bit stream.

Figure 2:
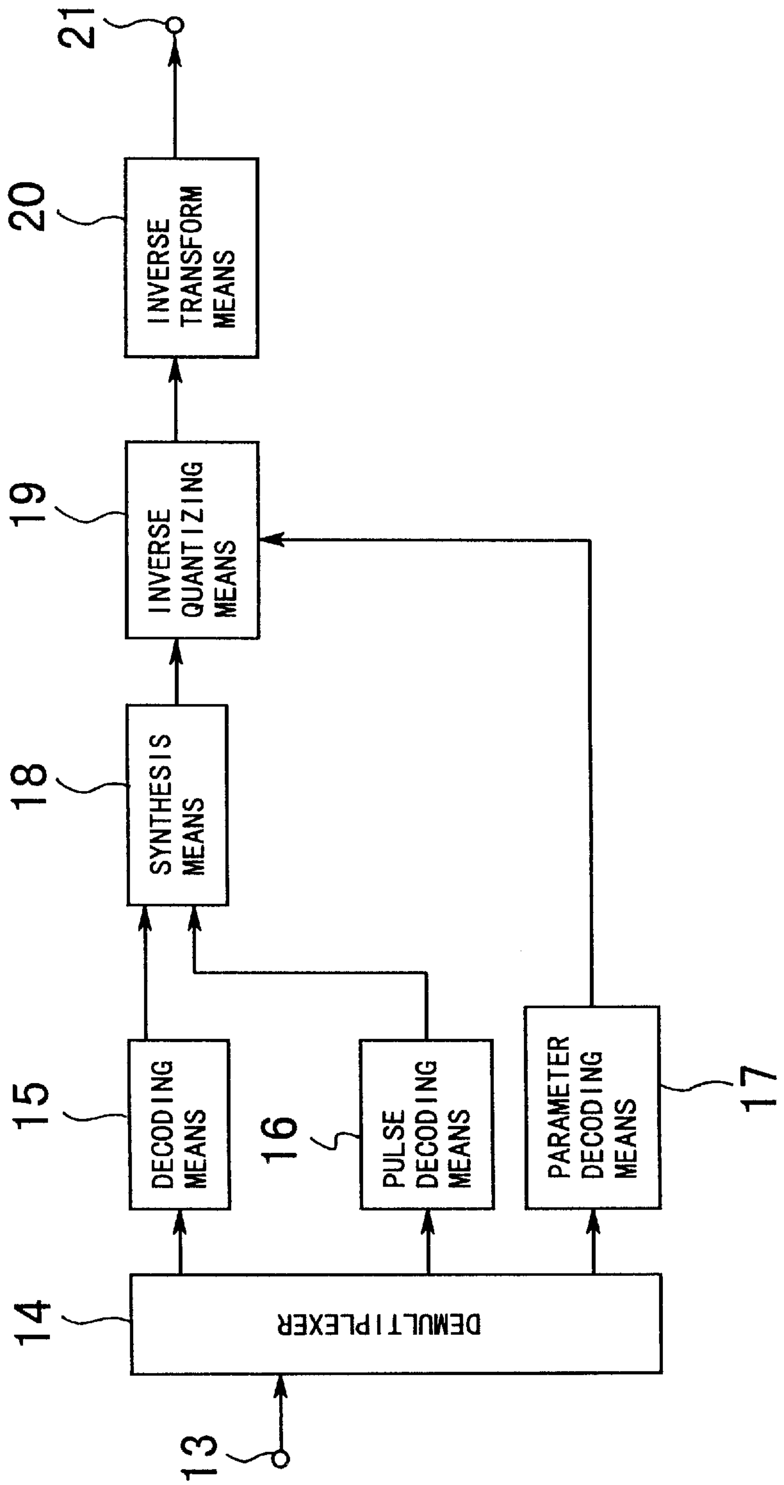
FIG. 2 is a block diagram showing the preferred embodiment of a decoding system according to the present invention.

FIG. 2 is a block diagram showing one embodiment of an adaptive transform decoding system according to the present invention. The adaptive transform decoding system includes an input terminal 13, a demultiplexer 14, a decoding means 15, a pulse decoding means 16, a parameter decoding means 17, a synthesis means 18, an inverse quantizing means 19, an inverse transform means 20 and an output terminal 21.

Figure 4:
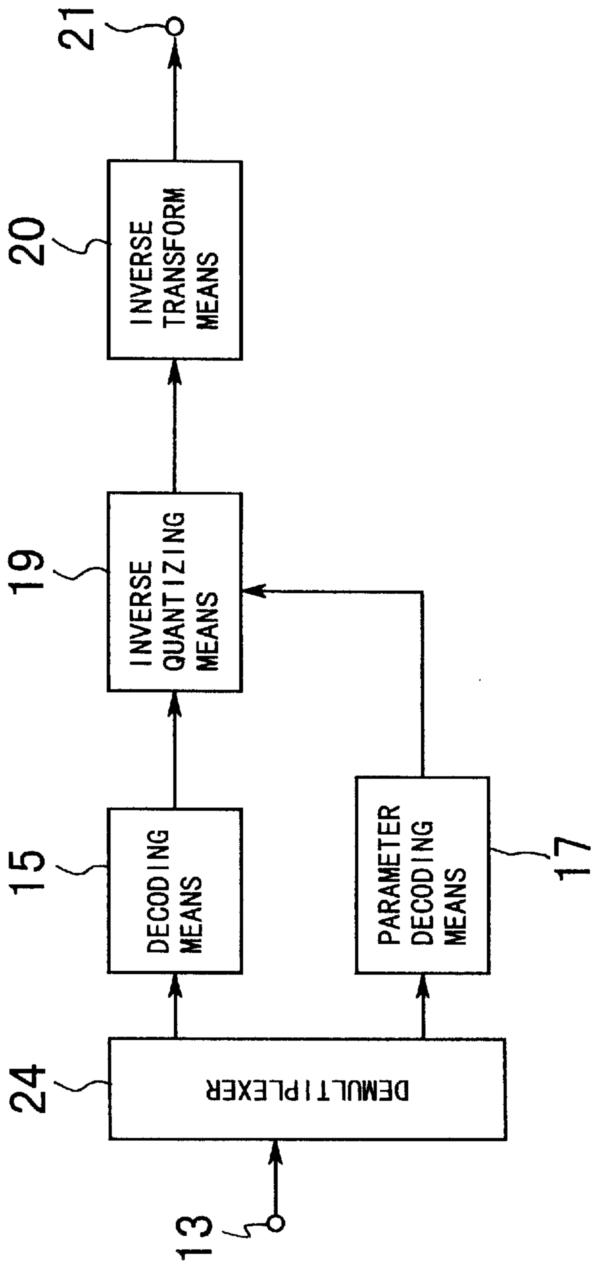
FIG. 4 PRIOR ART
FIG. 4 is a block diagram showing the conventional decoding system.

The shown embodiment of the adaptive transform decoding system is differentiated from the prior art shown in FIG. 4 in that the pulse decoding means 16 and the synthesis means 18 are added, and the demultiplexer 24 in FIG. 4 is replaced with the demultiplexer 14. Other elements are the same as those in the prior art shown in FIG. 4. Therefore, the following discussion will be concentrated to operations of the demultiplexer 14, the pulse decoding means 16 and the synthesis means 18.

In the demultiplexer 14, the bit stream is separated into the codes C1, C2 and C3. The C1 is fed to the decoding means 15, and the pulse decoding means 16. The code C2 is outputted to the parameter decoding means 17. The code C3 is outputted to the pulse decoding means 16.

In the pulse decoding means 16, at first, the code C3 is separated into the number a of elements to be replaced and the pulse code. Next, the pulse code is separated into the frequency index offset PP(m) of replaced elements, their polarity QQ(m) and their amplitude QQQ(m) with respect to m=1, 2, . . . , a. Also, the vector Z is taken as zero vector of M dimension. PP(0) is given by:

$$PP(0)=big\_values★2+1$$

For each m which is incremented by 1 from 1 to a, it is established:

$$PP(m)\leftarrow PP(m)+PP(m-1)$$

It is also established:

$$z(PP(m))=QQQ(m)+2$$

It should be noted when |QQ(m)| is coded for QQQ(m), it is established:

$$z(PP(m))=QQQ(m)$$

On the other hand, when P(m) is used in place of PP(m) upon coding, the operation of $$PP(m)\leftarrow PP(m)+PP(m-1)$$

becomes unnecessary. When the polarity of QQ(m) is negative, z(PP(m)) is multiplied by −1. The vector Z thus obtained is outputted to the synthesis means 18 as the quantized values.

In the synthesis means 18, the quantized values from the decoding means 15 are sorted in an ascending order as y(1), y(2), . . . y(bigvalues★2+count1★4), and y(big values★2+count1★4+1), y(bigvalues★2+count1★4+2), . . . , y(N) are set to zero. The quantized values y(1), y(2), . . . , y(N) and other quantized values z(1), z(2), . . . , z(N) from the pulse decoding means 16 are synthesized to establish synthesized quantized values x(1), x(2), . . . , x(N). If z(m) is equal to zero with respect to m=1, 2, . . . N, $$x(m)=y(m)$$

is established.

Otherwise, $$x(m)=z(m)$$

is established.

The synthesized quantized values are fed to the inverse quantizing means 19.

Figure 7:
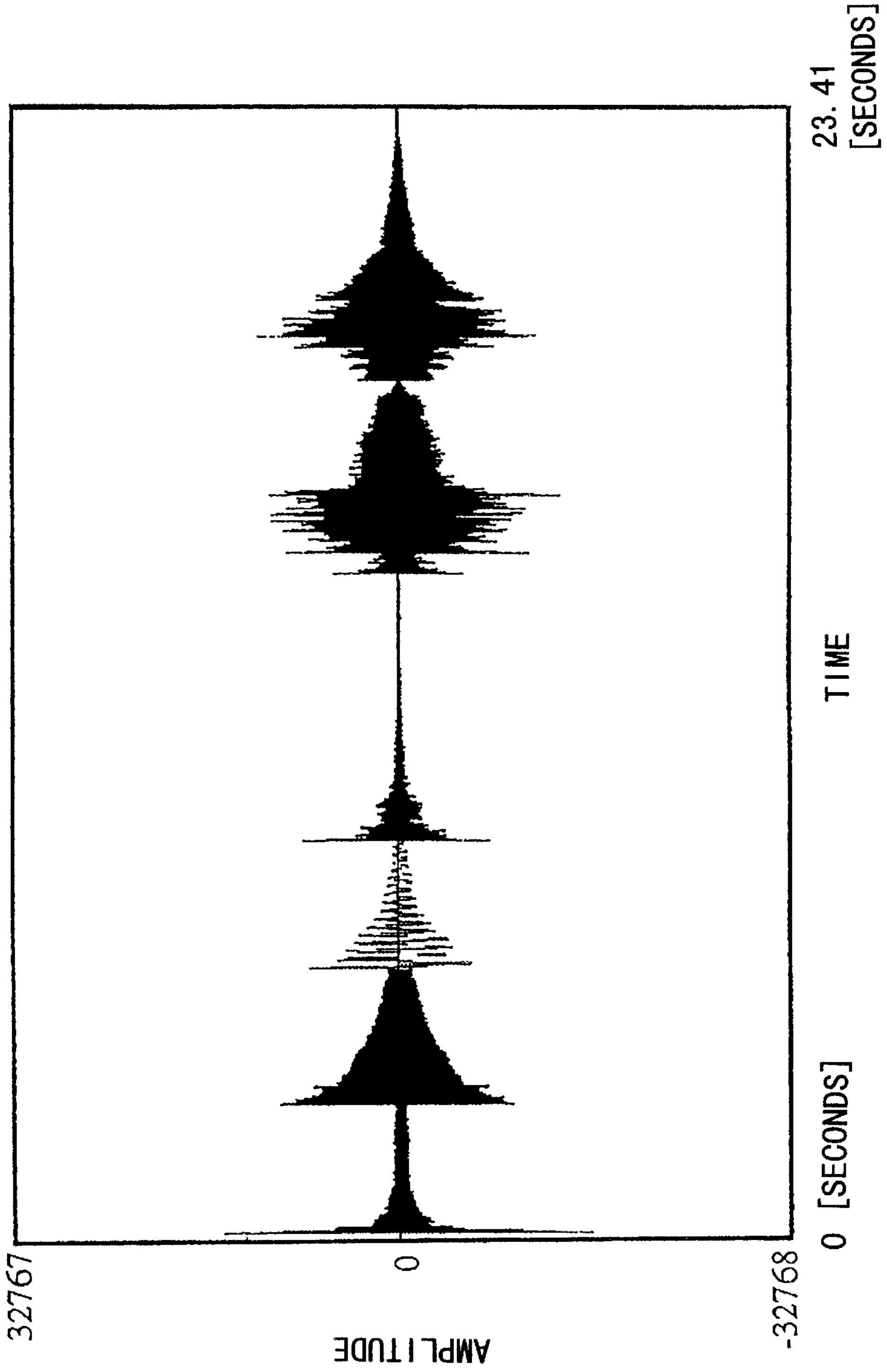
FIG. 7 is an illustration showing a waveform of a sound source employed in a coding experiments.
Figure 8:
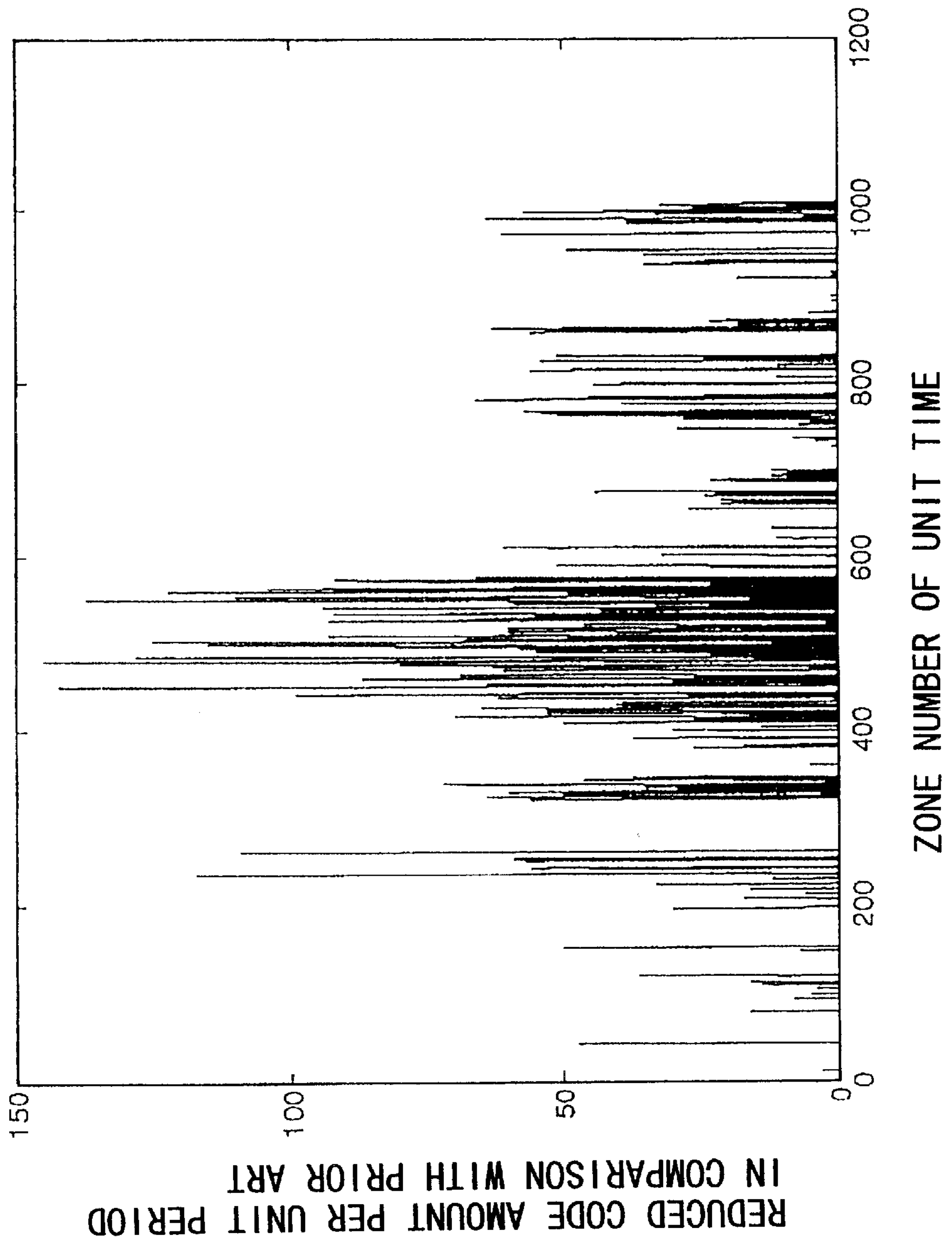
FIG. 8 is an illustration showing a reduced code amount by the present invention.

Discussion will be given for the reduction of the code amount in the case where the quantized value inputted to the coding means 7 in the prior art is used as the input to the selector 6 according to the invention. When a sound source “Glockenspiel” as represented by the waveform in FIG. 7 is to be coded, in the prior art, the average code amount per one frame is 1365 bits. In contrast to this, according to the present invention, in comparison with the prior art, the average code amount of 9.37 bit and the maximum code amount of 145 bits are reduced. The reduced code amount of each frame is shown in FIG. 8. In the first embodiment of the present invention as illustrated in FIG. 1, since the reduced code amount is used for coding, the coding quality at the same bit rate is improved in comparison with the prior art.

It should be noted that, in the first embodiment, concerning the frequency index offset PP(m) of the replaced element with respect to m=1, instead of coding PP(m) by $$PP(m)=(P(a-m+1)-PP(m-1)),$$

The following coding method can be taken.

At first, the frequency domain signal is divided into AR regions. Then, in the pulse coding means 8, the boundary frequency of respective regions is taken as AL(1), AL(2), . . . , AL(AR). The maximum value of a1 satisfying $$AL(al)<PP(1)$$

and the value expressed as $$a0=PP(1)=AL(a1)$$

are coded. When this coding method is taken, upon decoding in the pulse decoding means 16, PP(1) is obtained by:

$$PP(1)=AL(a2)+a0$$

Next, in the present invention, concerning a combination of the adaptive transform coding system and the adaptive transform decoding system, a discussion will be given for another embodiment. The second embodiment of the adaptive transform coding system of the present invention is illustrated in the block diagram of FIG. 1 similarly to the first embodiment.

In the second embodiment of the present invention is differentiated from the first embodiment of the present invention in the operation of the selector 6 and the pulse coding means 8. Hereinafter, the operation of the selector 6 and the pulse coding means 8 will be explained.

The selector 6 performs the process in three steps.

In the first step, similarly to the coding means 7 of the prior art, the quantized values are grouped in the ascending order of its frequency to form the vector X=[x(1), x(2), . . . , x(N)]. In the similar manner to the coding means 7 in the prior art, the elements x(1), x(2), . . . , x(N) of the vector X are divided into the type 1, the type 2 and the type 3 regions.

Next, as the second step, a that represents the number of the elements in the type 1 region to be replaced with a value having a smaller absolute value, such as zero is derived. M is assumed as a constant value of the upper limit of the number of elements to be replaced with a value having a smaller absolute value, such as zero. When coding is performed by replacing m elements in the type 1 region with a value having a smaller absolute value, such as 0, the total code amount L(m) of the codes, outputted from the coding means 7 and the pulse coding means 8, are derived with respect to m=0, 1, . . . , M. Then, a value of m, which makes the total code amount minimum, is set as the number a of the elements, whose values are replaced with a value having a smaller absolute value, such as zero.

Figure 6:
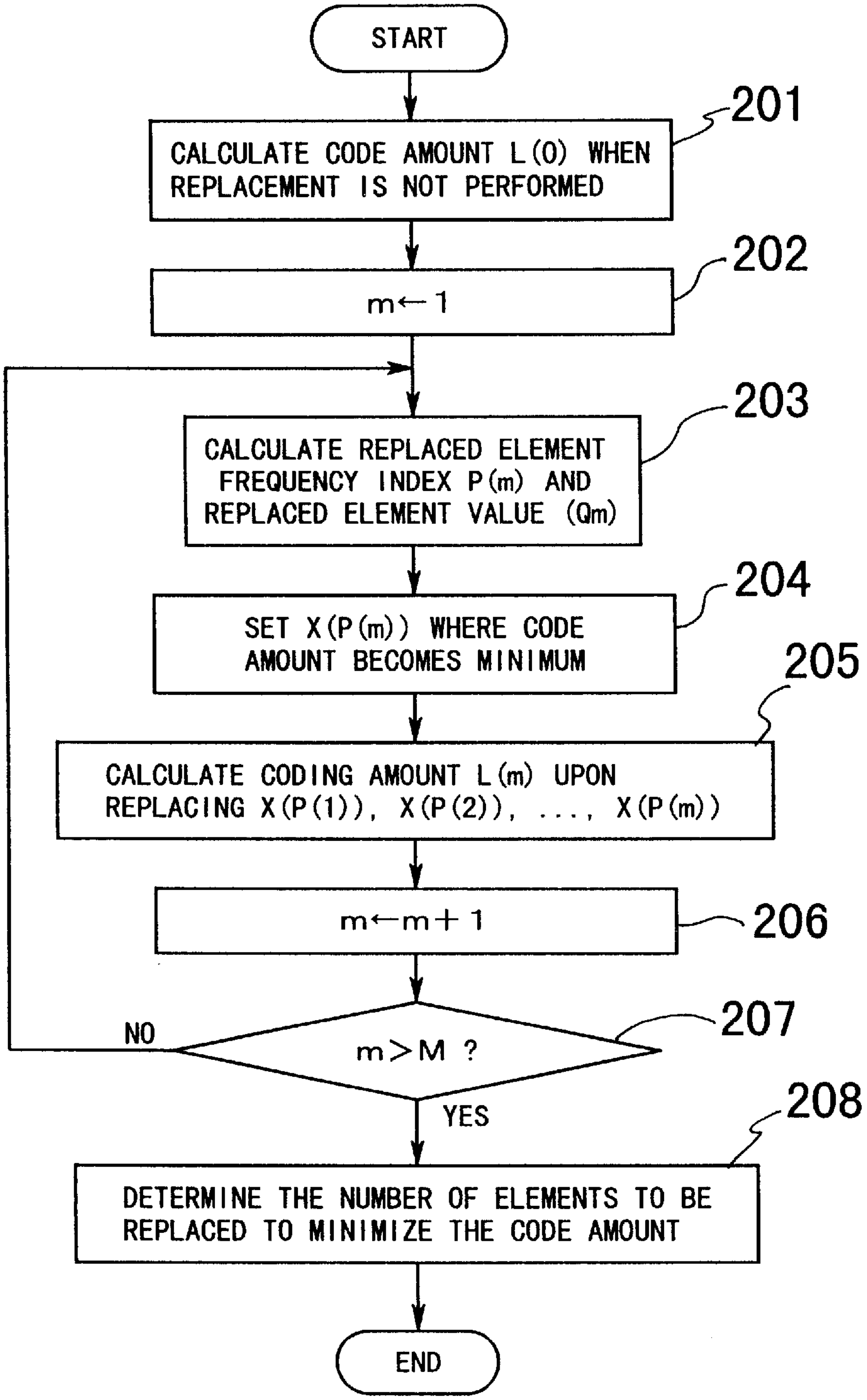
FIG. 6 is a flowchart for deriving the number of elements for replacing with a value having a smaller absolute value, such as zero.

FIG. 6 shows a flowchart showing the process to derive the number a. Respective steps will be discussed hereinafter.

At step 201, the code amount L(0) of the code outputted from the coding means 7 upon Huffman coding of respective elements in the type 1 region in the vector X, is derived. The value of the vector X is stored in the vector V.

At step 202, m is set at one.

At step 203, a value of i which is greater than or equal to one and less than or equal to bigvalues★2, and makes |x(i)| maximum, is set as the frequency index P(m) of the replaced element. On the other hand, the value Q(m) of the replaced element is set as x(P(m)).

At step 204, with respect to n=1, 2, . . . |Q(m)|−1, $$x(P(m))=n$$

is established to derive n which minimizes the code amount of the code outputted upon Huffman coding of respective elements in the type 1 region. This n is used to establish:

$$x(P(m))=n$$

$$R(m)=n$$

At step 205, the total code amount L(m) is derived by $$L(m)=B1+B2$$

as a sum of the code amount B1 of the code outputted from the coding means 7 upon Huffman coding of the type 1 region and the code amount B2 necessary for the pulse coding means 8 for coding the number m of the replaced elements, the frequency index P(1) of the replaced element, P(2), . . . , P(m), and the values Q(1), Q(2), . . . , Q(m) of the replaced elements. The code amount B1 is derived by simulating the operation of the coding means 7. The code amount B2 is derived by simulating the operation of the pulse coding means 8.

At step 206, m is incremented by one.

At step 207, if m is less than or equal to the upper limit M of the number of the replaced elements, the process returns to step 203.

At step 208, a giving min {L(a)|a=0, 1, . . . , M}, is set as the number of elements to be replaced with a value having a smaller absolute value, such as zero. The vector X is redefined as the vector V stored at step 201.

Finally, at the third step, a elements of the vector X obtained at the second step are replaced with a value having a smaller absolute value, such as zero. Then, $$\text{Vector } Y=[y(1), y(2), \ldots, y(N)]$$

is generated, and by the procedure set out later, $$\text{Vector } Z=[z(1), z(2), \ldots, z(N)]$$

is generated. The vector Y is outputted to the coding means 7 and the pulse coding means 8. The information relating to the non-zero elements of the vector Z is outputted to the pulse coding means 8.

To derive the vector Y and the vector Z, at first, the vector Z is set as the zero vector with the same dimension as the vector X and the vector Y is initialized by:

$$\text{Vector } Y=\text{Vector } X$$

Next, if the number a of the replaced element derived in the second step is greater than or equal to one, the frequency index P(m) of the replaced element and the value Q(m) of the replaced element derived in the second step are employed with respect to m=1, 2, . . . , a to derive:

$$z(m)=Q(m)$$

$$y(P(m))=R(m)$$

The number a of the replaced element, the frequency indexes P(1), P(2), . . . , P(a) of replaced elements and the values Q(1), Q(2), . . . , Q(a) of replaced elements that represent information relating to the non-zero elements of the vector Z are outputted to the pulse coding means 8.

Pulse coding means 8 derives a pulse code by coding the information relating to the non-zero elements of the vector Z. The derived pulse code is outputted to the multiplexer 11. In the coding of the vector Z, at first, concerning m=1, 2, . . . , a, {P(m), Q(m)} are sorted in ascending order of P(m) to derive {SP(m), SQ(m)}. Then, $$SPP(0)=1$$

is established. When a is greater than or equal to one, the frequency index offset SPP(m) of the replaced element, SPP(m)=(SP(m)−SP(m−1)), the polarity of SQ(m), and the amplitude SQQ(m) of the replaced element, SQQ(m)=(|SQ(m)|−|y(SP(m))|) are coded to obtain the pulse code. It should be noted that the coding may be performed by coding the amplitude |SQ(m)| of replaced elements. However, since |SQ(m)| is greater than |y(SP(m))|, it is more efficient to code SQQ(m). The pulse code and the number a of the replaced element are multiplexed as C3 to be outputted to the multiplexer 11. The code amount L3 of the code C3 is outputted to the adder 10.

The block diagram of the second embodiment of the adaptive transform decoding system according to the present invention is the same as the first embodiment of the adaptive transform decoding system of the present invention, as shown in FIG. 2. The second embodiment of the adaptive transform decoding system according to the present invention are differentiated in the operations of the pulse decoding means 16 and the synthesis means 18 in the first embodiment of the invention. Hereinafter, discussion will be given with respect to the operations of the pulse decoding means 16 and the synthesis means 18.

In the pulse decoding means 16, at first, the code C3 is separated into the number a of the replaced element and the pulse code. Next, the code C1 is decoded through the procedure similar to that of the decoding means 15. The obtained quantized values are sorted in the ascending order of the frequency, such as y(1), y(2), . . . , y(big values★2+count1★4). Next, the pulse code is separated into the frequency index offset SPP(m) of the replaced element, the polarity of SQ(m) and the amplitude SQQ(m) of replaced elements. The vector Z is established as the N-dimensional zero vector. SPP(0) is initialized by:

$$SPP(0)=1$$

Then, while m is incremented from one to a by one, with respect to each m, SPP(m−1) is added to SPP(m), and

|y(SPP(m))| is added to the amplitude SQQ(m) of the replaced element to establish z(SPP(m)). If SQ(m) has a negative value, z(SPP(m)) is multiplied by −1. The derived vector Z is outputted to the synthesis means 18 as the quantized values.

In the synthesis means 18, the quantized values from the decoding means 15 is sorted in an ascending order of the frequency to yield y(1), y(2), . . . , y(big values★2+count1★4) and to set y(big values★2+count1★4+1), y(bigvalues★2+count1★4+2), . . . y(N) at zero. By synthesizing y(1), y(2), . . . , y(N) and the quantized values z(1), z(2), . . . , z(N) outputted from the pulse decoding means 16, synthesized quantized values x(1), x(2), . . . , x(N) are derived. With respect to m=1, 2, . . . , N, if z(m) is zero, $$x(m)=y(m)$$

is established. Otherwise, $$x(m)=z(m)$$

is established. The synthesized quantized values are outputted to the inverse quantizing means 19.

Figure 9:
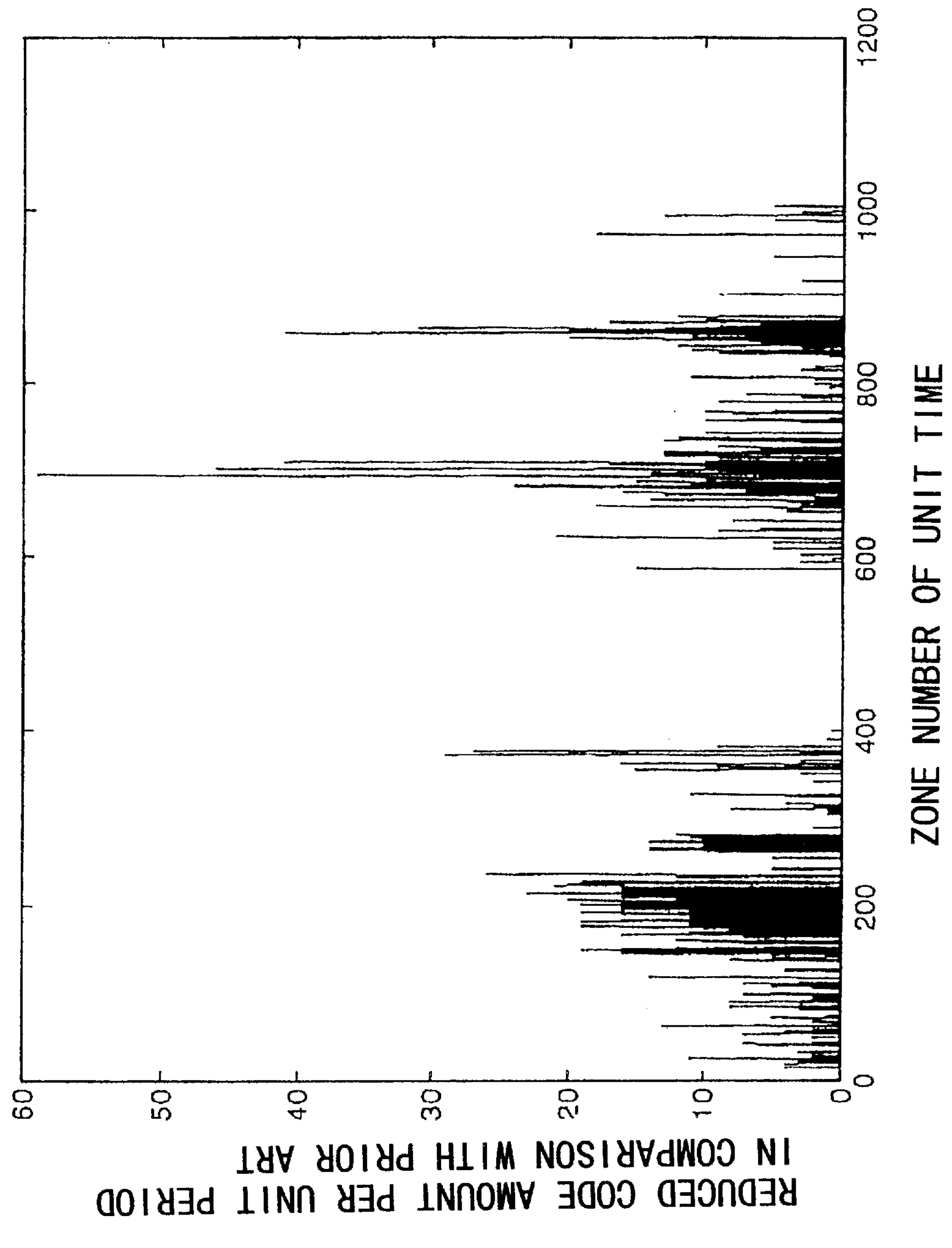
FIG. 9 is an illustration showing a reduced code amount by the present invention.

Discussion will be given hereinafter with respect to the reduction of the code amount when the quantized value supplied to the coding means 7 in the prior art is used as the input to selector 6 of the present invention. When a sound source "Glockenspiel" as represented by the waveform in FIG. 7 is to be coded, in the prior art, the average code amount per one frame is 1365 bits. In contrast to this, according to the present invention, in comparison with the prior art, the average code amount of 13.00 bits and the maximum code amount of 134 bits are reduced. The reduced code amount of each frame is shown in FIG. 9. In the first embodiment of the present invention as illustrated in FIG. 1, since the reduced code amount is used for coding, the coding quality at the same bit rate is improved in comparison with the prior art.

It should be noted that the second embodiment of the present invention is to improve the coding efficiency of the type 1 region, and the first embodiment of the present invention is to improve the coding efficiency by expanding the type 2 region and narrowing the type 1 region. Therefore, it is possible to establish embodiment in combination of the foregoing first and second embodiments.

It should be noted that, in the second embodiment of the present invention, concerning the frequency index offset SPP(m) of the replaced element with respect to m=1, instead of coding SPP(m) by $$SPP(m)=(SP(a-m+1)-SP(m-1)),$$

The following coding method can be taken.

At first, the frequency signal is divided into AR regions. Then, in the pulse coding means 8, with taking the boundary frequencies of respective regions as AL(1), AL(2), . . . AL(AR), the maximum a2 satisfying $$AL(a2)<SPP(1)$$

and the value of $$a0=SPP(1)-AL(a2)$$

may be encoded. When this method is taken, the decoder derives SPP(1) in the pulse coding means 14 by $$SPP(1)=AL(a2)+a0.$$

According to the present invention set forth above, coding efficiency can be remarkably improved.

The reason is that since a small number of quantized values having large absolute values and the remaining quantized values are coded by different means, the Huffman code table to be used for coding in the means (coding means 7 in FIG. 1) for coding the quantized values other than those having large absolute values can be much smaller than that in the prior art. Also, since the average code amount per one quantized value can be smaller to further improve coding efficiency.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. An adaptive transform coding system comprising:

a transform means for transforming an input signal into a frequency domain signal;

an analysis means for analyzing said input signal and said frequency domain signal to derive an allowable quantization error;

a quantizing means for quantizing the amplitude value of said frequency domain signal on the basis of a quantization step size to derive a quantized value and a quantization error, a quantization parameter determining means for determining said quantization step size with reference to said allowable quantization error and said quantization error and a total code amount;

a selector for analyzing the quantized value of said frequency domain signal to derive a first signal and a second signal;

a first coding means for coding said quantized value of said first signal with reference to said second signal to derive a first code and a first code amount;

a second coding means for coding said quantized value of said second signal to derive a second code and a second code amount;

a parameter coding means for coding said quantization step size to derive a third code and a third code amount;

an adder for deriving said total code amount of said first code amount, said second code amount and said third code amount; and a multiplexer for multiplexing said first code, said second code and said third code to generate a bit stream.

2. An adaptive transform coding system as set forth in claim 1, wherein said selector divides the quantized value of said frequency domain signal into a first signal and a third signal to generate a fourth signal, in which the absolute value of said quantized value of said first signal is replaced with smaller quantized value, and said second signal is generated by combining said third signal and said fourth signal.

3. An adaptive transform coding system as set forth in claim 1, wherein said selector derives said first signal and said second signal so that said total code amount becomes minimum.

4. An adaptive transform coding system as set forth in claim 1, wherein said first coding means generates said first code by coding the absolute value of said quantized value of said first signal, the polarity of the quantized value of said first signal and a frequency of said first signal.

5. An adaptive transform coding system as set forth in claim 4, wherein said first coding means derives a threshold value for said quantized value of said first signal to code a value derived by subtracting said threshold value from said quantized value of said first signal in place of said absolute value of said quantized value of said first signal.

6. An adaptive transform coding system as set forth in claim 5, wherein, in each sample of said first signal, the threshold value is value derived by adding one for the absolute value of the quantized value of a sample of said second signal at the same frequency to the sample of said first signal.

7. An adaptive transform coding system as set forth in claim 5, wherein a region of quantized value to be coded in said second coding means is limited, and in each sample of said first signal, said threshold value is a value derived by adding one to a maximum absolute value of an input region of said second coding means upon coding the signal having the same frequency as that of said sample by said second coding means.

8. An adaptive transform coding system as set forth in claim 4, wherein said first coding means codes the frequency of each sample of said first signal in sequential ascending order of the frequency, and for the sample other than said sample having the lowest frequency, a difference between the frequency of the sample and the frequency of the sample of the one preceding order are coded.

9. An adaptive transform coding system as set forth in claim 8, wherein said frequency signal is divided into a plurality of regions, and in said first coding means, in place of the frequency of the sample having the lowest frequency, the number of boundaries lower than said frequency of the sample having the lowest frequency, and the difference between said frequency of the sample having the lowest frequency and the maximum value in the region boundary frequencies lower than said frequency of the sample having the lowest frequency, are encoded.

10. An adaptive transform decoding system comprising:

a demultiplexer for separating an input signal into a first code, a second code and a third code;

a first decoding means for decoding said first code with reference to said second code to derive a first signal;

a second decoding means for decoding said second code to derive a second signal;

a parameter decoding means for decoding said third signal to derive a quantization step size;

a synthesis means for synthesizing said first signal and said second signal for deriving a synthesized signal;

an inverse quantizing means for inverse quantizing said quantized value of said synthesized signal to derive an inverse quantized signal; and an inverse transform means for transforming said inverse quantized signal into a time domain to derive a time domain signal.

11. An adaptive transform decoding system as set forth in claim 10, wherein said first decoding means derives a frequency of the quantized value, an absolute value of the quantized value and a sign of the quantized value by decoding said first code to set a frequency of the quantized value, an absolute value of the quantized value and a sign of the quantized value of said first signal, respectively.

12. An adaptive transform decoding system as set forth in claim 11, wherein said first decoding means derives a threshold value and takes a value derived by adding said threshold value to the absolute value of the quantized value derived by decoding said first code as an absolute value of the quantized value of said first signal, in place of the absolute value of the quantized value derived by decoding said first code.

13. An adaptive transform decoding system as set forth in claim 12, wherein, in each sample of said first signal, the threshold value is an absolute value of the quantized value of the sample of said second signal of the same frequency to said sample.

14. An adaptive transform decoding system as set forth in claim 12, wherein said second decoding means has restriction in an inverse quantized value, and in each sample of said first signal, the threshold value is a value derived by adding one to the maximum absolute value of said restriction when said second decoding means decodes the signal having the same frequency as said sample.

15. An adaptive transform decoding system as set forth in claim 11, wherein said first decoding means derives a difference between the frequency and the frequency of the sample of the lowest frequency by decoding, and derives the frequency of the sample other than said sample having the lowest frequency by cumulatively adding the difference of said frequency to the frequency of the sample having the lowest low frequency.

16. An adaptive transform decoding system as set forth in claim 15, wherein the frequency signal is divided into a plurality of region, in said first decoding means, the number of region boundaries and the difference between said frequencies are derived by decoding, and a value derived by adding a difference of said frequencies to a frequency of region boundary indicated by said number of region boundary is taken as the frequency of the sample having the lowest frequency.

17. An adaptive transform decoding system as set forth in claim 10, wherein said synthesis means generates a signal replacing the quantized value of the sample having the same frequency as the frequency of each sample of said first signal with the quantized value of said first signal to take the replaced signal as said synthesized signal.

18. An adaptive transform coding and decoding system comprising:

a transform means for transforming an input signal into a frequency domain signal;

an analysis means for analyzing said input signal and said frequency domain signal to derive an allowable quantization error;

a quantizing means for quantizing amplitude value of said frequency domain signal on the basis of a quantization step size to derive a quantized value and a quantization error, a quantization parameter determining means for determining said quantization step size with reference to said allowable quantization error and said quantization error and a total code amount;

a selector for analyzing the quantized value of said frequency domain signal to derive a first signal and a second signal;

a first coding means for coding said quantized value of said first signal with reference to said second signal to derive a first code and a first code amount;

a second coding means for coding said quantized value of said second signal to derive a second code and a second code amount;

a parameter coding means for coding said quantization step size to derive a third code and a third code amount;

an adder for deriving said total code amount of said first code amount, said second code amount and said third code amount;

a multiplexer for multiplexing said first code, said second code and said third code to generate a bit stream a demultiplexer for separating an input signal into a first code, a second code and a third code;

a first decoding means for decoding said first code with reference to said second code to derive a first signal;

a second decoding means for decoding said second code to derive a second signal;

a parameter decoding means for decoding said third signal to derive a quantization step size;

a synthesis means for synthesizing said first signal and said second signal for deriving a synthesized signal;

an inverse quantizing means for inverse quantizing said quantized value of said synthesized signal to derive an inverse quantized signal; and an inverse transform means for transforming said inverse quantized signal into a time domain to derive a time domain signal.

* * * * *